United States Patent [19]

Schroeder et al.

[11] Patent Number: 4,464,752
[45] Date of Patent: Aug. 7, 1984

[54] MULTIPLE EVENT HARDENED CORE MEMORY

[75] Inventors: George F. Schroeder, Wayne; Garry E. Pitt, Towaco; John F. Scully, East Orange; Lell E. Barnes, North Caldwell, all of N.J.

[73] Assignee: The Singer Company, Little Falls, N.J.

[21] Appl. No.: 318,726

[22] Filed: Nov. 6, 1981

[51] Int. Cl.³ ............................................. G06F 11/00
[52] U.S. Cl. ........................................ 371/38; 371/51
[58] Field of Search ......................... 371/37, 38, 51, 10

[56] References Cited

U.S. PATENT DOCUMENTS

| | | | |
|---|---|---|---|
| 4,031,374 | 6/1977 | Groudan et al. | 371/38 |
| 4,037,091 | 7/1977 | Beuscher | 371/51 |
| 4,335,458 | 6/1982 | Krol | 371/38 |
| 4,358,848 | 11/1982 | Patel | 371/38 |
| 4,371,963 | 2/1983 | Edwards et al. | 371/51 |
| 4,413,327 | 11/1983 | Sabo et al. | 371/10 |

Primary Examiner—Jerry Smith
Assistant Examiner—Michael R. Fleming
Attorney, Agent, or Firm—Morris Liss; Thomas W. Kennedy

[57] ABSTRACT

A computer system is provided for reconstructing a word, which is altered during cycling of the computer memory when a nuclear event occurs. The computer system includes a nuclear event detector, a circuit for setting flags in response to the detection of an event, a generating circuit for generating a random variable time interval in response to the flags, a circuit for performing block parity on the data in the memory in response to the flags, and correcting circuit for correcting the altered word in the memory in response to the block parity circuit. The computer system further includes a circuit for correcting multiple memory word upsets in response to the block parity circuit and an updating circuit for performing block parity during sequential storage or random storage of the data words before or after an event.

11 Claims, 8 Drawing Figures

REACTION TO EVENT WITH NO DATA LOSS

REACTION TO EVENT WITH LEVEL I UPSET

REACTION TO EVENT WITH LEVEL 2 UPSET

MULTIPLE EVENT HARDENED CORE MEMORY

BACKGROUND OF THE INVENTION

Random access memories which must retain vital data, even after being subjected to nuclear radiation while writing or restoring data, can be rendered immune to the radiation effects by storing small quantities of data doubly, triply or multiply redundantly in the memory. This enables a single word loss to be remedied by reference to other error-free copies of the affected word. However, practical limitations on memory size prohibit the entire contents of a typical memory from being stored in a redundant manner.

Memory word loss may be obviated in a random access memory without the need for redundant storage, in the case of the fixed data, by the use of the plated wire type non-destructive readout memory. If suitable circumvent circuitry is provided to protect the words stored in the plated wire memory, the memory will be safe from the effects of nuclear radiation insofar as the fixed data is concerned. This is because of the non-destructive readout characteristics of this type of memory. The radiation hardened plated wire memory, therefore, may be used for the storage of fixed data since under normal operation the fixed data will be read only from the memory and, due to the non-destructive readout properties of the memory, any word being read during a nuclear event can be reconstituted from the memory itself. However, the radiation hardened plated wire memory does present problems when used for variable data storage, since it is vulnerable insofar as a word being written into memory is concerned.

Thus, the radiation hardened plated wire memory is not immune to the effects of nuclear radiation which occurs when a particular variable data word is being updated, since such a particular data word being written into the plated wire memory during a nuclear event could be lost. Therefore, without further protection, the plated wire memory is not suitable for the storage of variable data.

Moreover, the non-destructive readout plated wire memory is more costly than the destructive readout magnetic core type, and significant cost problems arise when the non-destructive readout type of memory is used for the fixed data storage. The option of using the less expensive destructive readout memory for fixed data storage presents a problem, however, since it is susceptible to the effects of nuclear radiation on both the words being written into the memory or read from the memory. This is because the destructive readout characteristics of the magnetic core memory create the need for restoring data after each readout operation. This makes this type of memory vulnerable to the radiation effects when data is being read from the memory or written into the memory. Redundant storage of all the contents of a destructive readout magnetic core memory is equally impractical.

The invention disclosed in U.S. Pat. No. 4,031,374, assigned to the present assignee, provides an improved system for rendering the destructive readout magnetic core random access memory immune to the effects of nuclear radiation.

The protective system of the patent includes circumvent circuitry which responds to the detection of a nuclear radiation event to isolate magnetic core random access memory from the effects thereof. The circumvent circuitry enables unaddressed memory locations to be protected. However, it is extremely difficult by circumvent circuitry to control the required circuits in the memory should exposure to the nuclear radiation occur during an actual write or read/restore operation. This means that the word being read from the core memory, or written into the memory, during the exposure may be lost. As described, the plated wire memory operates on a non-destructive readout basis which safeguards a stored word from being destroyed during a read cycle, even if it is being read when a nuclear event occurs. In the case of the magnetic core memory, however, the word desired in each read operation must be restored in a subsequent write operation, so that the affected word may be lost during the presence of nuclear radiation. Additional means are provided to reconstruct words being accessed during the nuclear event. In the case of the plated wire memory, the additional means is required only to reconstruct a word actually being written into the memory during the nuclear event. In the case of the core memory, however, the corrective measures must be taken with respect to words being read or written during the nuclear event.

The system disclosed in the patent discloses apparatus and procedures for taking such corrective measures. Although the system of the patent operates generally satisfactorily where a single nuclear event occurs or where there is a relatively long time period between nuclear events, it is not capable of taking corrective steps where relatively closely spaced nuclear upsets occur which are capable of upsetting the electronics before full correction may be obtained.

The corrective measures disclosed in the patent render the memory system immune to the effects of nuclear radiation, and the like. The system includes circumvent circuitry which serves to limit all currents in the memory access network to safe values during a radiation event, so as to limit data loss to a maximum of one word per event and to prevent burnout of the memory and of its associated components. The system also serves to correct single word errors which can occur to words being written or read during the radiation pulse. The single word error correction is achieved by partitioning the data words in the memory into blocks; by providing an error correction word for each such block, and by reconstructing from the error correction word the word being read or written during the radiation event. This may be achieved by first loading all zeros into the memory address of the affected word, and then reconstructing the affected word by the provision of an "Exclusive-OR" logic means which forms a computed error correction word from the entire block, including the affected word (which is now zeros), and the original error correction word. The computed error correction word is a reconstruction of the affected data word.

SUMMARY OF THE INVENTION

The present invention is particularly suited for correcting stored data which is altered during a multiple nuclear event sequence. This is accomplished by permitting multiple word error corrections in conjunction with randomizing the time period during which the recovery of lost data takes place.

Utilization of the present invention obviates the necessity of using expensive non-destructive readout memories such as the plated wire type. The result is a practical and compact memory capable of comprising corrective actions in the event of multiple nuclear upsets.

The above-mentioned objects and advantages of the present invention will be more clearly understood when considered in conjunction with the accompanying drawings, in which:

DETAILED DESCRIPTION OF THE INVENTION

Figure 1:
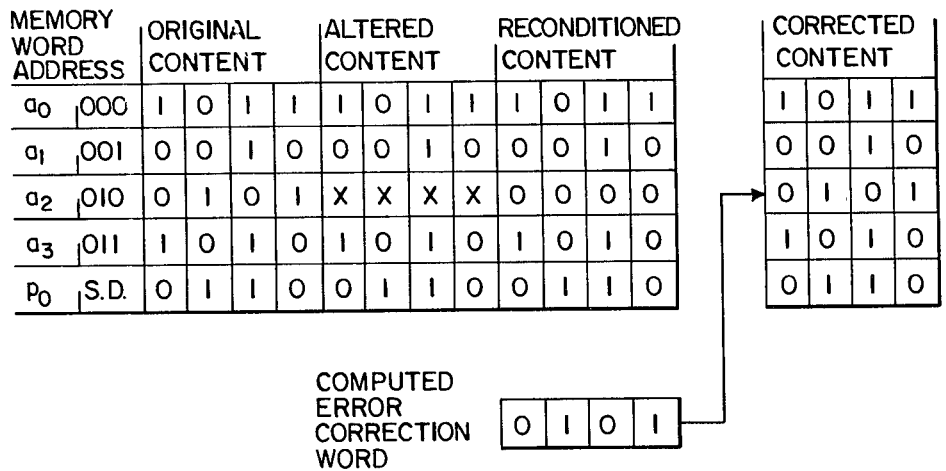
FIG. 1 is a table setting forth an example of word recovery by performing block parity as taught by the prior art.

Previously mentioned U.S. Pat. No. 4,031,374 discloses a parity procedure for correcting a lost data word. The patent sets forth a word recovery system such as shown in FIG. 1, in which the block comprises four words, as shown in the "Memory Word Address" Column, and in which the four words are located in the fixed data storage portion of the memory at addresses $a_0$, $a_1$, $a_2$ and $a_3$; and in which the address of the error correction word $P_0$ is at any predetermined memory location (S.D.) The block of data shown in the column "Original Content", and the particular block illustrated in FIG. 1 consists of four data words of four bits each, followed by the error correction word in which each bit is an even parity of the corresponding column of bits in the block.

Should a nuclear radiation event occur during the accessing of the word stored at address $a_2$, it may be assumed that the particular word is lost, as shown in the "Altered Content" column. It should be noted that in the example under consideration, only one word is affected by the radiation event, and that the address of the affected word is known. Following the radiation event, the affected location is addressed, and it is loaded with all zeros, as shown in the "Reconditioned Content" column. The original word which was affected by the radiation event may now be reconstructed by forming a computed error correction word, as an Exclusive-OR sum word of the entire block of data, including the affected word (which is now zeros), plus the original error correction word. This computed error correction word is a reconstruction of the word which was affected by the radiation pulse, as shown in the "Corrected Content" column. Actually, the computed error correction word is the Exclusive-OR sum of the parity block.

There are several word recovery error correction systems which may be implemented to achieve the desired results of the invention, that is, the recovery of a potentially lost word when a radiation pulse occurs during a write cycle or during a read/restore cycle of a random access memory.

One aspect of the present invention is an extension of the word correction process as taught in U.S. Pat. No. 4,031,374. However, rather than proceeding with a single level of block parity, multiple levels of block parity are carried out. In each new level of block parity, new blocks are created in such a manner that no word is grouped with a word that it was associated with in a former block. One such method of forming block parity levels is described herein.

Figure 2:
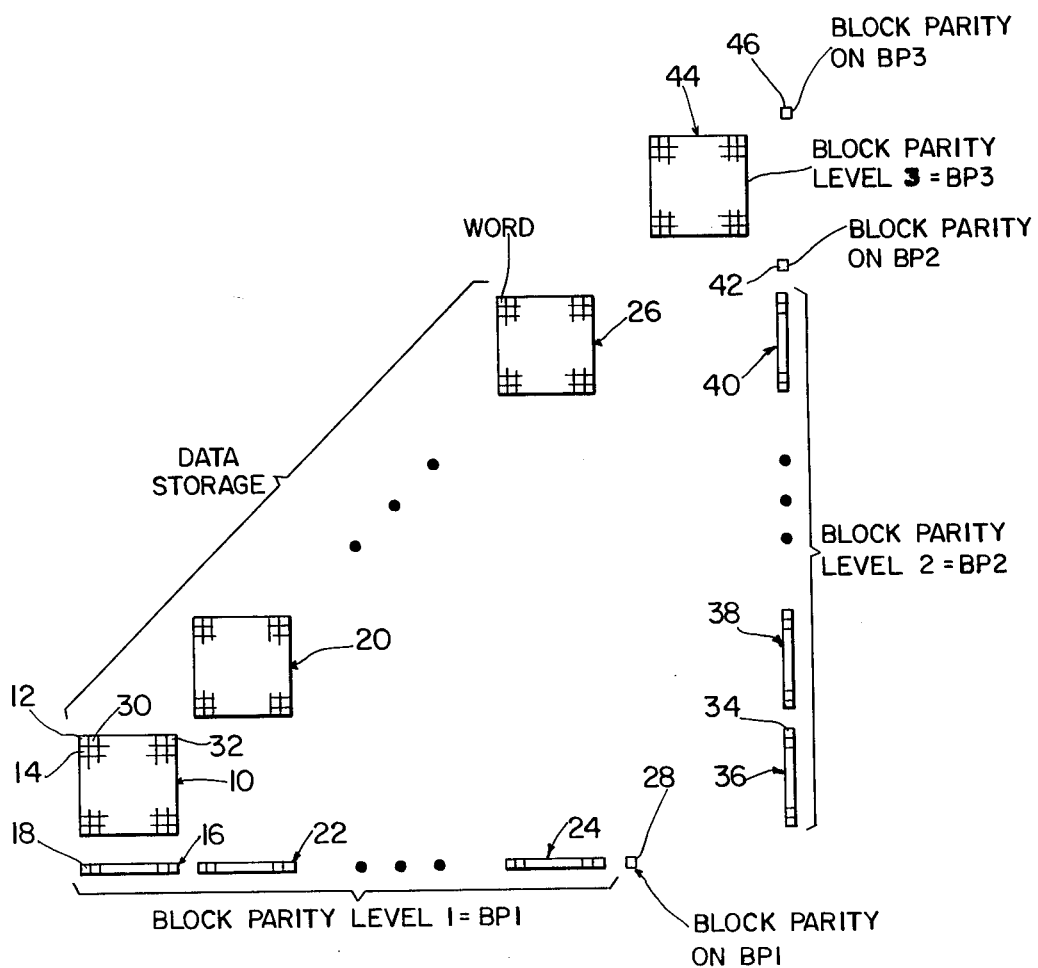
FIG. 2 is a schematic representation of a multiple section memory illustrating how several levels of block parity are constructed.

A first level of block parity (BP1) is shown in FIG. 2. As will be noted in the lower left-hand corner, a section of memory is generally indicated by reference numeral 10. Each word cell, such as 12, 14 of section 10, includes a number of bits which constitute a data word. The first level of block parity is obtained by performing the Exclusive-OR summation on a column-by-column basis, as taught by the mentioned patent. Thus, the words 12 and 14, etc., in the first column of section 10 undergo an Exclusive-OR summation to form the parity word 18 in memory section 16. In a similar manner, block parity is performed on section 20 and memory section 22 will include the results thereof. This occurs for each of the sections in memory until the final section 26 renders its parity results in memory section 24. Thereafter, an additional level of sophistication may be effected by performing the Exclusive-OR summation function on each of the memory sections 16, 22, 24 so as to effect a resultant block parity which is stored in memory section 28. In the event of a nuclear event, the formation of a computed error correction word is achieved in the manner set forth in the mentioned patent.

An extension of the block parity concept enables a greater number of error corrections to be made by forming additional block parity summations. Thus, it is possible to run a row-by-row Exclusive-OR summation of the memory sections 10, 20, 26. For example, if the words 12, 30–32 in the first row of section 10 underwent summation, a block parity word 34 would be formed in memory section 36. Such a row-by-row summation could be carried out as previously discussed until all words in the sections underwent summation to form block parity level 2 (BP2). The contents of block parity level 2 would be stored in memory sections 36, 38–40. As in the case of the first block parity level, an additional block parity summation may be performed on memory sections 36, 38–40 and the results stored in memory section 42.

Indeed, any pattern may be selected to perform Exclusive-OR summations on the various blocks of memory including diagonals and summations on the words appearing in the same corresponding coordinate within a section, for example, the word appearing in the first column, first row, of each section, beginning with word 12 in section 10. The results of such a third level of block parity would be stored in memory sections 44 and as in the previous instances a block parity may be performed on those contents and stored in memory section 46.

As a summary of the block parity levels, the following definitions are provided:

Parity Definitions

BP1 = Exclusive-OR summations of columns of word cells in y direction.

BP2 = Exclusive-OR summations of rows of word cells in x direction.

BP3 = Exclusive-OR summations of corresponding word cells in a preselected pattern.

BP on BP1 = Exclusive-OR summations of row of BP1's taken all or part at a time.

BP on BP2 = Exclusive-OR summations of columns of BP2's taken all or part at a time.

BP on BP3 = Exclusive-OR summations of BP3's taken all or part at a time.

With the development of multiple block parity levels, it is possible to correct for n disturbances if a corresponding number of levels of parity were derived. However, each additional level requires logic manipulation and extra memory. This translates to slower processing of the data itself as well as greater costs of fabrication. In order to minimize the number of levels necessary, a second aspect of the invention comes into play. This includes the randomizing of the time for correcting a word which has been disturbed. Thus, in a multiple upset situation, only a chance timing of a subsequent event to coincide with a critical recovery time can cause a higher level of upset and thus with some level of confidence the number of levels necessary to handle such a multiple event disturbance can be minimized. With the critical periods occurring at random times, every preselected or random time sequence of events has a very small chance of causing a higher level of upset. With only two levels of block parity, probabilities of reaching an upset level from which recovery is impossible are easily made to be less than one in a million.

Before explaining the randomization of time considerations of the invention, it is important to know that a nuclear event has various types of radiation with various effects on electronics. These effects are both transient and permanent. Some transient effects on electronics have a short time constant while other effects have time constants of about one millisecond. Thus, the component recovery (to the extent the component will recover) will be near completion in a few milliseconds. Thus, though the radiation level subsides, the effects linger and it is customary to inhibit memory operation beyond the time the radiation subsides during which time the solid state material comprising the memory anneals. Typical designs have inhibited the memory operation approximately five ms. to allow adequate annealing. This has often been called the clamp period since no memory operation is allowed. Following this clamp period is the recovery during which lost data (if any) is reconstructed. After the five millisecond clamp period, the electronics are capable of operation but, by virtue of the present invention, the clamp period will be extended so that the memory is inhibited for a variable period of time. By so doing, it becomes unlikely that an enemy may design a multiple radiation upset weapon which will surpass the error correction capability of the invention.

Figure 3:
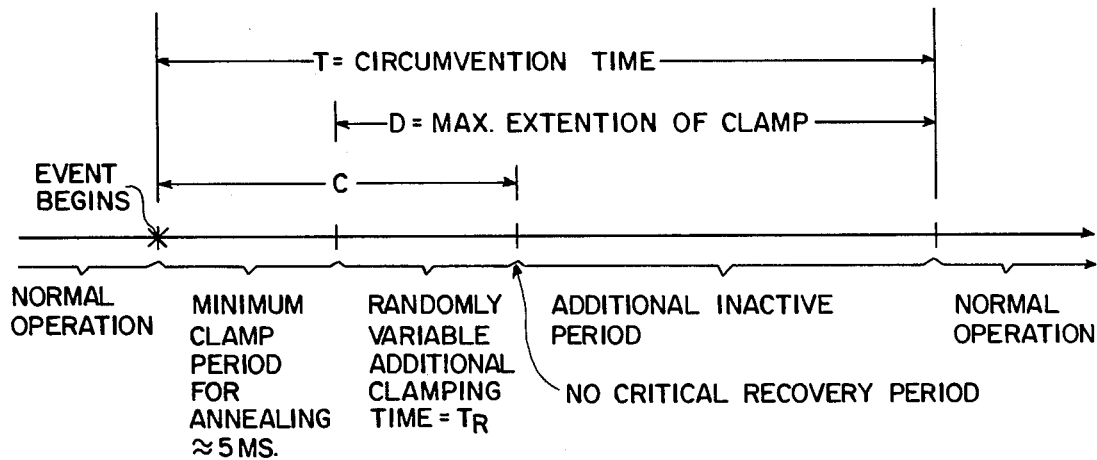
FIG. 3 is a timing diagram illustrating reaction by the present invention to an event where no data loss has occurred.

FIG. 3 is a time-event diagram which illustrates how the invention operates in the instance of a single radiation event during which time it has been determined that data has not been lost. The absence of such loss is simply detected by utilizing conventional radiation sensors which causes data flags to be set, indicating the occurrence of potential data loss for a particular memory location being addressed. Referring to FIG. 3, the first time interval indicates a period of normal memory operation. A radiation event occurs at the instant indicated which determines a constant time interval T referred to as circumvention time. The initial interval during this circumvention time is the minimum clamp period for annealing, as just discussed. After this minimum clamp period there is a randomly variable time period $T_R$ during which there is additional clamping of the circuit. The minimum clamp period and the randomly variable clamping period is labeled as time interval C, during which time the memory will not be further accessed. The time period C passes and since there has been no potential loss of data during the radiation event, there is no additional critical recovery period as there will be in later examples shown in FIGS. 4 and 5. The final period of the circumvention time is indicated as an additional inactive period which will be longer or shorter, depending upon how much data must be recovered. The maximum extension of memory clamp, after the minimum clamp period, is labeled as time interval D. Though the time, T, from the detection of the event to the end of circumvention time is selected here to be a constant period, it can be a variable period with certain changes in the probabilities of further upset.

Figure 4:
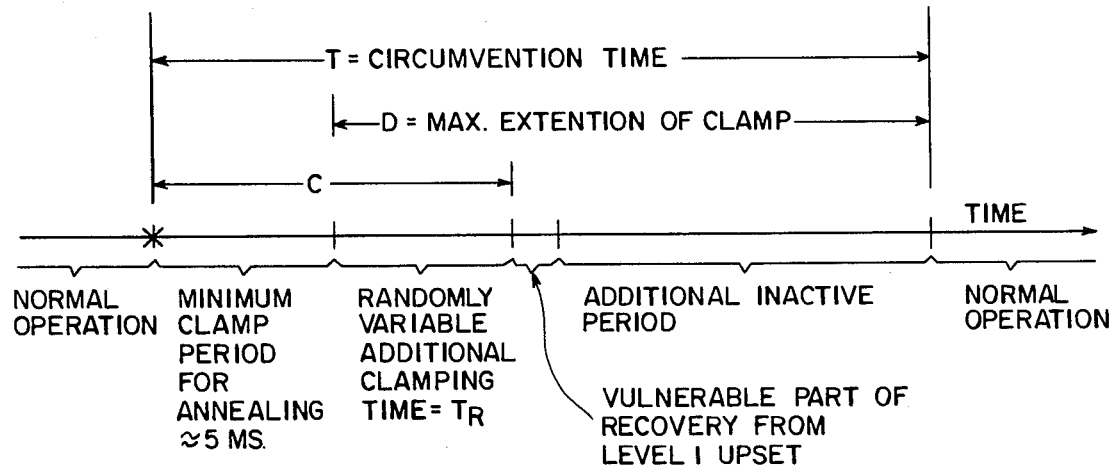
FIG. 4 is a timing diagram similar to that of FIG. 3 but showing reaction to an event with one level of upset.

FIG. 4 shows a time-event diagram similar to that of FIG. 3, however, in the case of FIG. 4, flags have been set indicating that the memory was cycling during the radiation event thereby raising the possibility that data was lost. Thus, a level 1 upset is assumed. The timing diagram of FIG. 4 departs from that of FIG. 3 in that the time interval C is immediately followed by a time period during which an error correction word is being computed as a result of block parity level 1 (FIG 2). The period during which the error correction word is computed is illustrated in FIG. 4 as the vulnerable part of recovery from level 1 upset.

Figure 5:
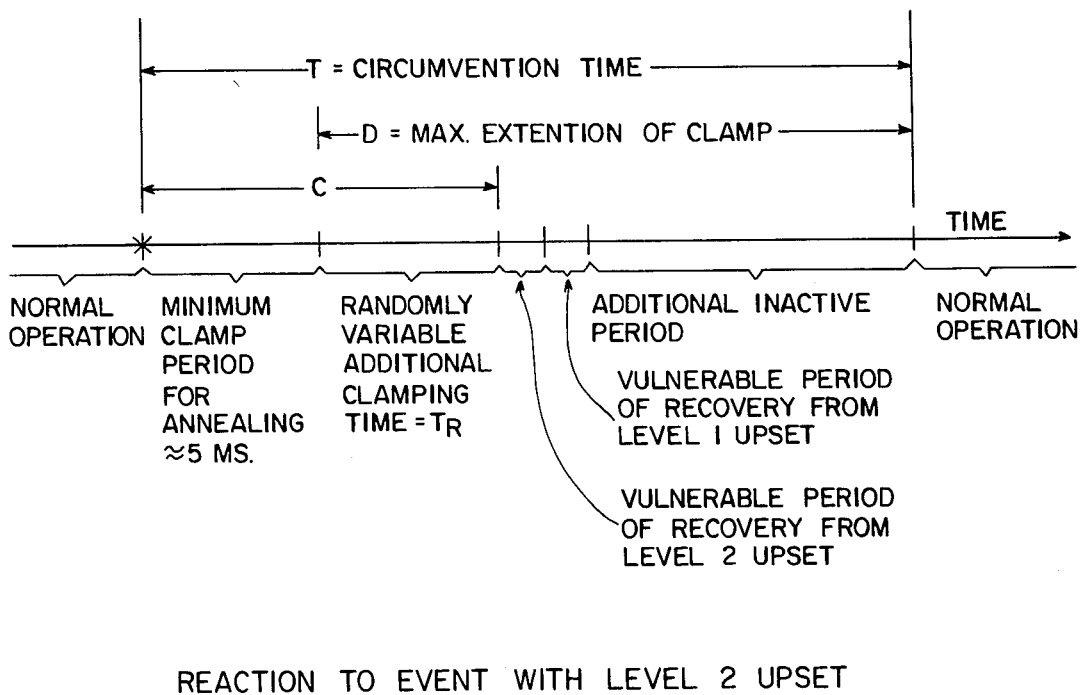
FIG. 5 is a timing diagram similar to that of FIG. 3 but showing reaction to an event with two levels of upset.

FIG. 5 is an extension of the timing diagram shown in FIG. 4, except that flags would be set to indicate the occurrence of two radiation events during periods when the memory was cycling so that there is the potential that two data words have been lost. In order to remedy this, two error correction words must be computed, one after the other, in contiguous or disjoint time periods, after the clamping period C. This is indicated by the second vulnerable period of recovery from level 2 upset, as shown in FIG. 5. The computation of the second error correction word will be as a result of block parity level 2 (FIG. 2).

Figure 6:
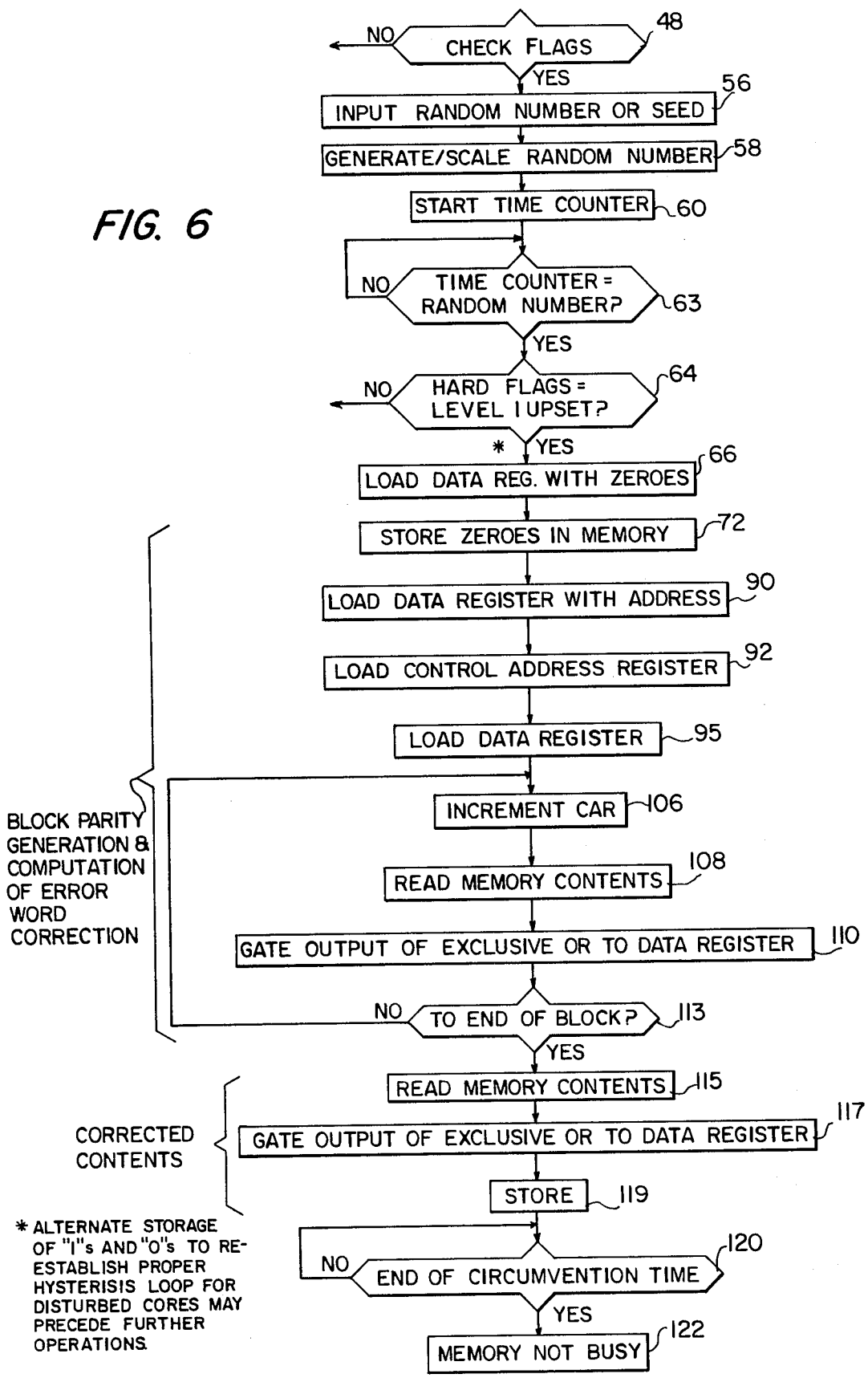
FIG. 6 is a flow diagram for the circuitry shown in FIG. 7.
Figure 7:
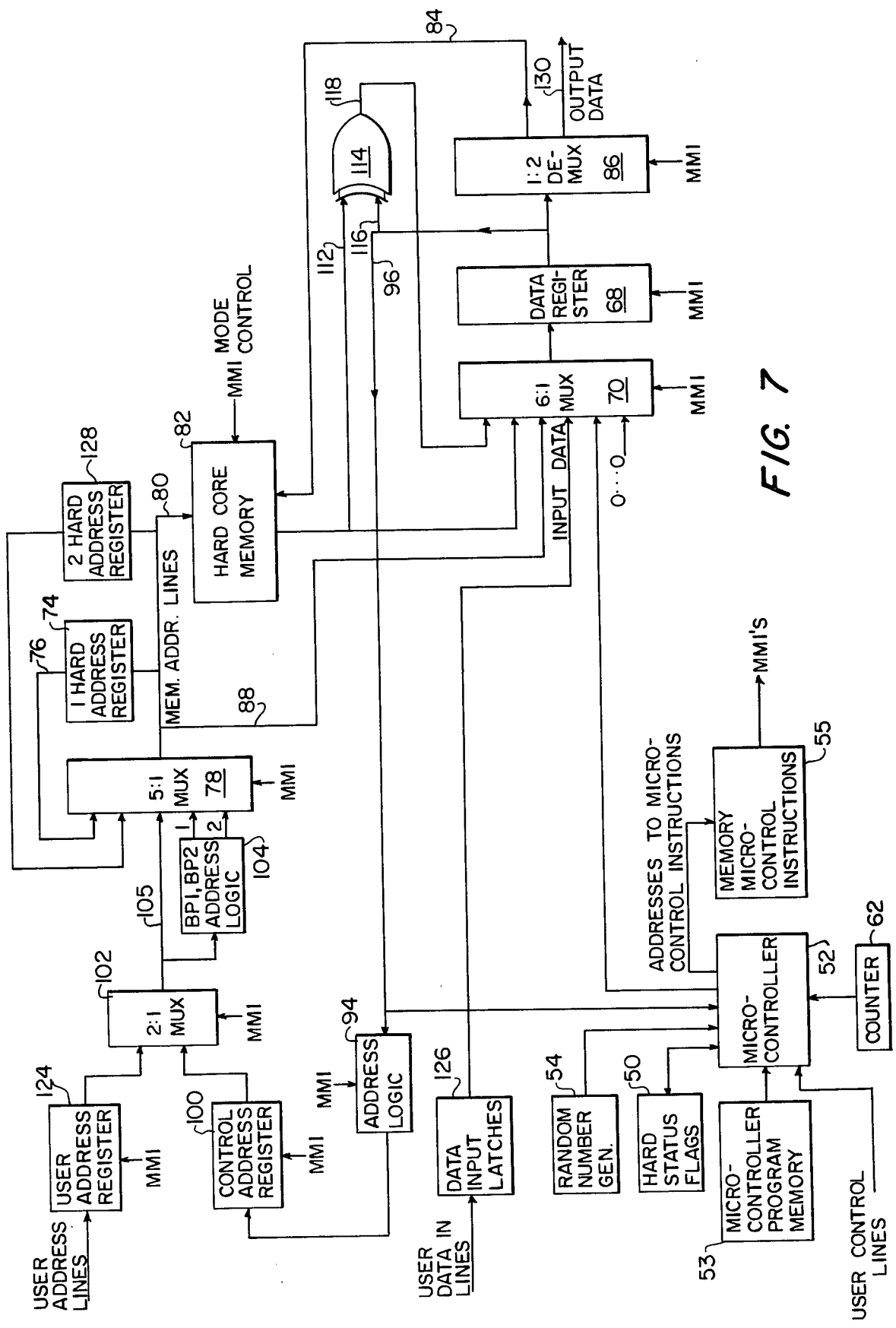
FIG. 7 is a block diagram of the present invention illustrating a means for achieving block parity generation (a form of error correction word) and reconstruction of a compromised word(s).

A circuit of the present invention for achieving block parity generation and correction of an error word is shown in FIG. 7. FIG. 6 shows a corresponding flow chart for event recovery by virtue of block parity level 1 and indicates a first step 48 wherein event flags are checked to determine whether the memory 82 (FIG. 7) was cycling during an event. If the answer to this inquiry is negative, then the program exits from the event recovery routine and continues with normal operation, as would be the case if power failed. Referring to FIG. 7, it is seen that the flags are contained within register 50 which will be radiation hardened. The register 50 communicates with microcontroller 52 which primarily serves as a state machine and has a conventional construction. The nondestructible readout microcontroller program memory 53 communicates with the microcontroller. The instructions for the main memory microcontrol are contained within radiation loss proof memory 55, under control of the microcontroller.

A random number generator 54 seeds the microcontroller 52 which then scales and further randomizes a random number output, as shown by steps 56 and 58 of FIG. 6. The purpose of the random number generation is to obtain the randomly variable additional clamping time shown in FIGS. 3–5. Step 60 of the flow chart starts counter 62 (FIG. 7) to operate as a timer while comparison step 63 continually compares the contents of counter 62 with the random number. When an equality is detected, determination is made in step 64 as to whether the flags indicate a level 1 event. If the flags indicate a level other than the first level, a similar routine as the one being discussed will be followed, corresponding to that level. If a level 1 event has been detected, the data register 68 is loaded with zeros via MUX 70, as shown in step 66 which initiates block parity generation and computation of the error word correction as previously discussed. Next, step 72 is initiated wherein the address contained in the radiation hardened address register 74 addresses memory 82, via leads 76, memory address lines 80 and MUX 78. The zeros contained in data register 68 are transferred to the compromised location (address contained in register 74) via data register output leads to 1:2 MUX 86 and lead 84 to the memory.

The data register 68 is then loaded with the address contents of register 74 via MUX 78 interconnecting leads 88 and MUX 70. The step is indicated by reference numeral 90 in FIG. 6. The succeeding step 92 proceeds to load the beginning of the column address from the address in the data register 68, via address logic 94 into the control address register 100. Step 95 proceeds to load the data register 68 with the memory contents at the address contained in control address register 100, via MUX 102 and lead 105 connecting the output of MUX 102 to the input of MUX 78.

The next step 106 achieves the incrementing of the control address register 100 and step 108 ensures that the memory contents from the address now contained within the control address register 100 are fed to Exclusive-OR 114 via lead 112. The following step 110 assures that there are successive Exclusive-OR operations performed by Exclusive-OR gate 114 on the word contents from memory 82, appearing at gate input 112. The second input 116 to the Exclusive-OR gate will be the data word currently stored in data register 68. The contents of the data register 68 will then be updated to contain the data resulting at the output 118 of gate 114 which is transmitted to the data register 68 via MUX 70. A determination is then made at step 113 whether or not the end of a block has been reached. If not, the program returns to step 106. However, if the end of the block is reached, the memory contents at the address contained in the control address register 100 as modified by BP1 address logic 104 and MUX 78 (step 115) is read and presented to Exclusive-OR gate 114 via lead 112. Succeeding step 117 transfers data from the output of the Exclusive-OR gate 114 to the data register 68 via MUX 70. The final step to achieve corrected contents of the error word is to transfer the corrected word contained in data register 68 through DE-MUX 86, to the address contained in address register 74, in memory 82 via MUX output leads 84. Memory 82 is addressed by memory address lines 80 from MUX 78 to achieve the appropriate addressing of memory 82.

With the corrected contents now contained in memory 82, the next step 120 occurs to determine whether the end of the constant circumvention time duration has occurred. If it has not, further delay results until the circumvention time has ended. At that time, step 122 places memory 82 in a non-busy condition so that normal operation may again continue utilizing the user address register 124 and data input latches 126. Data will be read out from memory during normal operation, along output lead 130.

During the event recovery demonstrated by the flow chart of FIG. 6, should a second upset occur, the affected memory location will be stored in radiation hardened address register 128 and a level 2 recovery must be performed in a manner similar to a level 1, described above, to first recover the second word lost and then repeat the level 1 routine to recover the first word lost.

Figure 8:
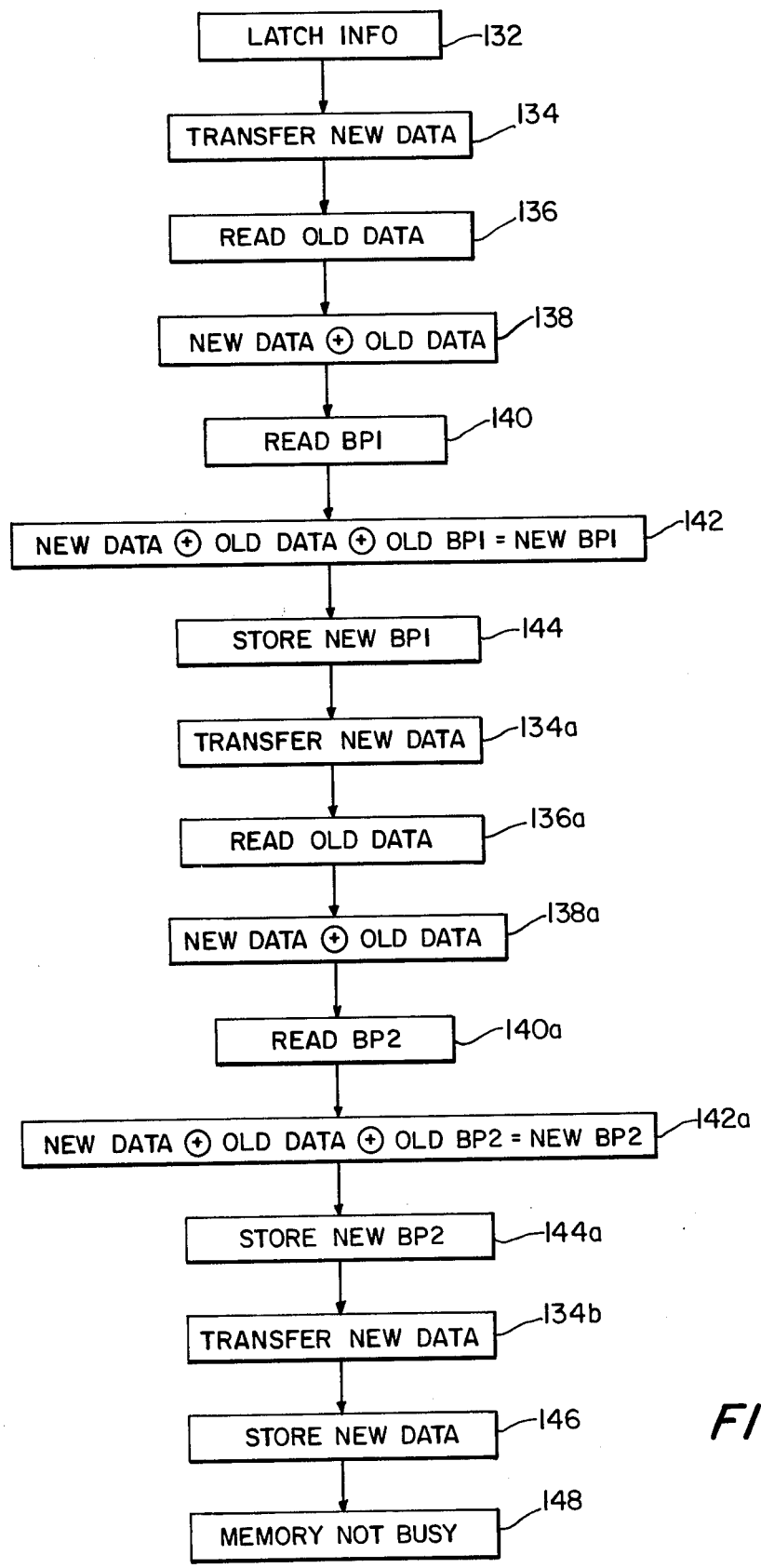
FIG. 8 is a flow diagram for loading the memory shown in FIG. 7.

FIG. 8 is a flow diagram illustrating loading of memory 82 with automatic block parity generation. A flow diagram assumes two levels of block parity for purposes of illustration. However, it should be understood that memory loading with automatic block parity generation may be extended to a greater multiple of block parity levels in accordance with the disclosure herein.

Referring jointly to FIGS. 7 and 8, step 132 of FIG. 8 indicates the latching of information which will include user data which is latched in data input latches 126 as well as the storage in register 124 of the user address.

Subsequent step 134 accomplishes the storing of new data in data register 68. This is achieved when the contents of data latches 126 are fed to the data register 68 via the 6:1 MUX 70. Step 136 achieves the reading of old data. Specifically, there is a transfer of the contents of register 124 to the memory address lines 80 via 2:1 MUX 102, lead 105 and 5:1 MUX 78.

During step 138 there is an Exclusive-OR logic operation of new data and old data. Particularly, data from memory 82 appears at the first input of the Exclusive-OR gate 114 as gate input 112. Data stored in register 68 appears at a second gate input 116. The Exclusive-OR output 118 is connected to the data register 68 via the 6:1 MUX 70 so that the result of the Exclusive-OR operation is now stored in register 68. During step 140, the first block parity word is read when the contents of the user address register 124 is transferred through the 2:1 MUX 102, address logic 104, 5:1 MUX 78 and finally memory address lines 80. During step 142, the result of step 138 thereof then undergoes an Exclusive-OR operation with the first block parity word. The result is a new first block parity word. Referring to FIG. 7, this is achieved when the gate output of the Exclusive-OR gate 114 is transferred to the data register 68, via the 6:1 MUX 70. During step 144, the new first block parity word is stored when the contents of the data register 68 are stored at an address derived from the user address register 124, the contents of which appear on memory address lines 80 after traversing the circuit path including the 2:1 MUX 102, address logic 104 and 5:1 MUX 78. The actual contents from data register 68 appear at the input of memory 82 after passing through 1:2 DEMUX 86.

The above steps 134–144 may be again repeated for the automatic block parity generation of a second block parity word. Similar steps are given corresponding reference numerals. Thus, during step 134a, new data is transferred to the data register 68 by the circuitry described in connection with step 134. In accomplishing block parity generation of a second block parity word, the second indicated output from the address logic 104 is employed to output the address of the second block parity word on the memory address lines 80. As a result of step 134b, new data is again transferred to data register 68 when the contents from data input latches 126 are transferred to the data register 68, via 6:1 MUX 70. New data is stored as a result of step 146 when the contents from the data register 68 are stored at an address derived from the user address register 124 which, as in previous cases, appears at memory address lines 80 after passing through the 2:1 MUX 102, lead 105 and 5:1 MUX 78. Final step 148 of the flow diagram indicates the end of memory loading and signifies that the memory is no longer busy with a loading operation.

According to the described invention, it will be seen that the present invention is capable of correcting data which is being cycled through memory during multiple radiation upsets.

It should be understood that the invention is not limited to the exact details of construction shown and described herein for obvious modifications will occur to persons skilled in the art.

We claim:

1. A circuit for reconstructing one or more words erroneously altered when nuclear events occur during cycling of a memory, the circuit comprising:
   means for detecting an event and limiting data loss to one word per event;
   means for setting and detecting data flags signifying occurrence of an event at a critical time of the memory cycle;
   means for generating a variable time interval preceding data recovery in response to flags signifying an event;
   means for performing block parity on the data in memory along at least one preselected parity block of locations in memory in response to said flags,; and
   means for correcting any word in memory which was altered in response to said block parity means;
   means for correcting multiple memory word upsets in response to said block parity means; and
   means for updating block parity during sequential storage or random storage of data words before or after an event.

2. The subject matter of claim 1 wherein the variable time interval generating means comprises a random number generator for generating a scaled random number; and
   counter means for incrementing a count until it equals the scaled random number.

3. The subject matter set forth in claim 2 and further wherein the block parity means includes gating means for performing an Exclusive-OR logic function on data words located in a parity block of memory locations.

4. A method for reconstructing a word erroneously altered during cycling of data in a memory when a nuclear event occurs and for limiting a loss to one word maximum per said event, the method comprising the steps:
   detecting an event and limiting the loss to one word maximum per event and setting flags signifying occurrence of an event;
   generating a random variable time interval in response to flags signifying an event;
   performing block parity on data in memory along at least one preselected parity block of locations in memory; and
   correcting any word in memory which was altered.

5. The method set forth in claim 4 wherein the step of generating a random variable time interval includes the generation of a scaled random number; and ascending counting of time pulses until equality is reached between the count and the random number.

6. The method set forth in claim 5 wherein block parity is determined as the words located in the parity block of memory locations undergo Exclusive-OR logic determinations.

7. The method set forth in claim 6 wherein the error correction means, such as multiple storage, are used to correct the compromised memory word.

8. The method set forth in claim 7 wherein multiple data losses are corrected.

9. The method of claim 8 applied to any destructive read out storage medium wherein an annealing period of any duration including none is used.

10. The method of claim 9 applied to any destructive read out storage medium wherein recovery from higher levels of upset is in contiguous or disjoint time segments.

11. The method of claim 10 applied to any destructive read out storage medium where the circumvention time is a constant or a variable time.

* * * * *